(12) United States Patent
Park et al.

(10) Patent No.: US 9,865,635 B2
(45) Date of Patent: Jan. 9, 2018

(54) IMAGE SENSOR

(71) Applicant: Samsung Electronics Co., Ltd., Suwon-si, Gyeonggi-do (KR)

(72) Inventors: Donghyuk Park, Yongin-si (KR); Seungwon Cha, Seoul (KR); Cheolju Kang, Seoul (KR); Yitae Kim, Hwaseong-si (KR); Jongeun Park, Seongnam-si (KR); Jungchak Ahn, Yongin-si (KR); Yujung Choi, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 15/408,085

(22) Filed: Jan. 17, 2017

(65) Prior Publication Data

US 2017/0207263 A1 Jul. 20, 2017

(30) Foreign Application Priority Data

Jan. 20, 2016 (KR) ........................ 10-2016-0007218

(51) Int. Cl.
*H01L 27/146* (2006.01)

(52) U.S. Cl.
CPC .... *H01L 27/14614* (2013.01); *H01L 27/1464* (2013.01); *H01L 27/14621* (2013.01); *H01L 27/14627* (2013.01)

(58) Field of Classification Search
CPC ......... H01L 27/14614; H01L 27/14621; H01L 27/14627
See application file for complete search history.

(56) References Cited

U.S. PATENT DOCUMENTS

| 8,350,305 | B2 | 1/2013 | Itonaga et al. |
| 8,462,249 | B2 | 6/2013 | Shinohara |
| 8,614,759 | B2 | 12/2013 | Watanabe et al. |
| 8,716,769 | B2 | 5/2014 | Ihara et al. |
| 8,823,070 | B2 | 9/2014 | Hisanori |
| 8,829,578 | B2 | 9/2014 | Maeda |

FOREIGN PATENT DOCUMENTS

| JP | 2003-104301 | 11/2004 |
| JP | 2004-311777 A | 11/2004 |
| JP | 2008-238848 | 4/2010 |
| JP | 2010-073840 A | 4/2010 |

(Continued)

*Primary Examiner* — Matthew Reames
(74) *Attorney, Agent, or Firm* — Myers Bigel, P.A.

(57) ABSTRACT

An image sensor and a method of fabricating the same are disclosed. The image sensor may include a substrate including an active region defined by a device isolation layer, a photoelectric conversion layer, a well impurity layer, a floating diffusion region, and a transfer gate. When viewed in a plan view, a lower portion of the transfer gate may include a first surface in contact with the device isolation layer, a second surface substantially perpendicular to the first surface, and a third surface connected to the first and second surfaces. The third surface may face the floating diffusion region. A first portion of a gate insulating layer may be adjacent to the third surface and thinner than a portion adjacent to the first surface or the second surface, and this may facilitate more efficient transfer of an electron from the photoelectric conversion layer to the floating diffusion region.

19 Claims, 15 Drawing Sheets

(56) References Cited

FOREIGN PATENT DOCUMENTS

| | | |
|---|---|---|
| JP | 2009-191031 | 3/2011 |
| JP | 2044-044544 A | 3/2011 |
| JP | 2010-19600 | 8/2011 |
| JP | 2011-159758 A | 8/2011 |
| KR | 10-2005-0082648 | 9/2005 |
| KR | 10-2005-0027369 | 10/2006 |
| KR | 10-2006-0104881 | 10/2006 |
| KR | 10-0653849 | 12/2006 |

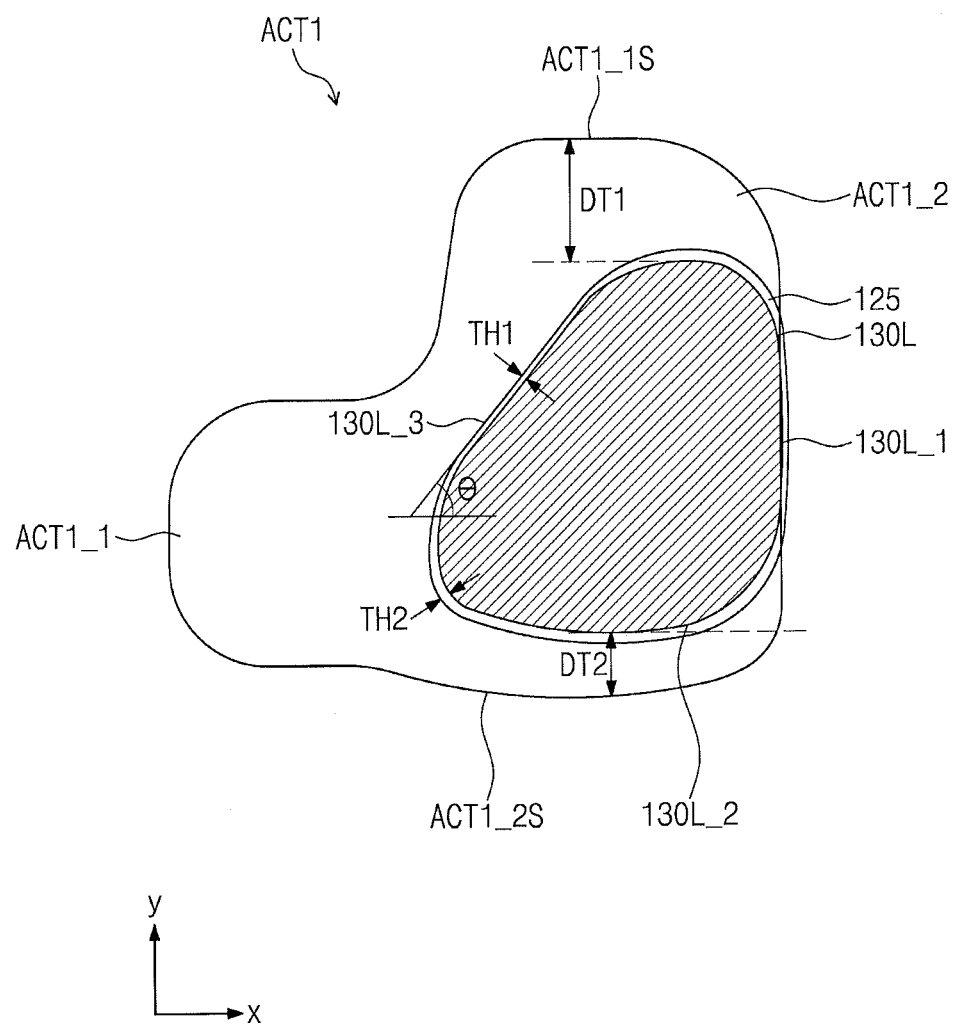

IMAGE SENSOR

CROSS-REFERENCE TO RELATED APPLICATION

This U.S. non-provisional patent application claims priority under 35 U.S.C. §119 to Korean Patent Application No. 10-2016-0007218, filed on Jan. 20, 2016, the entire contents of which are hereby incorporated by reference for all purposes.

BACKGROUND

The present disclosure relates to an image sensor, and in particular, to a metal-oxide-semiconductor image sensor (CMOS CIS).

An image sensor is a semiconductor device configured to covert optical images into electrical signals. The image sensor may be classified into two types: a charge coupled device (CCD) type and a complementary metal-oxide-semiconductor (CMOS) type. In general, the CMOS-type image sensor may be called "CIS". The CIS may include a plurality of two-dimensionally arranged pixels, each of which includes a photodiode (PD) that coverts incident light into an electrical signal.

As an integration density of the image sensor increases, a size of each pixel or photodiode in the image sensor becomes less and less. A photodiode may be strongly affected by a small variation in structure or external environment, and thus, the photodiode may suffer from low light sensitivity.

SUMMARY

Some example embodiments of the present disclosure provide a highly-sensitive image sensor within a given area.

According to some example embodiments of the present disclosure, an image sensor may include a substrate including an active region defined by a device isolation layer, a photoelectric conversion layer formed in the active region, a well impurity layer formed in the substrate and on the photoelectric conversion layer, a floating diffusion region formed in a portion of the well impurity layer, and a transfer gate including a lower portion and an upper portion thereon. The upper portion of the transfer gate may have a top surface higher than a top surface of the substrate. The lower portion of the transfer gate may be inserted into other portion of the well impurity layer and may have a first surface in contact with the device isolation layer, a second surface substantially perpendicular to the first surface, and a third surface contacting both the first and second surfaces, when viewed in a plan view. The third surface may face the floating diffusion region.

According to some embodiments of the present disclosure, an image sensor may include a substrate including an active region defined by a device isolation layer and a transfer gate including a lower portion inserted into the active region and an upper portion connected to the lower portion, the upper portion of the transfer gate having a top surface higher than that of the substrate. The active region may include a first portion and a second portion. When viewed in a plan view, the first portion may extend in a first direction, and the second portion may have a greater width than that of the first portion and may extend in a second direction perpendicular to the first direction. Also, when viewed in a plan view, the lower portion of the transfer gate may have a first surface extending diagonally across the second portion of the active region.

According to some embodiments of the present disclosure, a substrate may be provided, which may include an active region defined by a device isolation layer. A photoelectric conversion layer may be provided, which may be formed in the active region; additionally, a well impurity layer formed in the substrate and on the photoelectric conversion layer may be provided. A floating diffusion region may be formed in a portion of the well impurity layer. A transfer gate may be provided, which may be inserted into the well impurity layer and may have a first surface facing the floating diffusion region. A gate insulating layer may be provided, which may have a non-uniform thickness and may be interposed between the well impurity layer and the transfer gate. A first thickness of the gate insulating layer, interposed between the first surface and the well impurity layer may be thinner than a second thickness of the gate insulating layer interposed between a second surface of the transfer gate and the well impurity layer.

BRIEF DESCRIPTION OF THE DRAWINGS

Example embodiments will be more clearly understood from the following brief description taken in conjunction with the accompanying drawings. The accompanying drawings represent non-limiting, example embodiments as described herein.

FIG. 5 is an enlarged plan view illustrating a first active pattern and a lower portion of a transfer gate of FIG. 3.

DETAILED DESCRIPTION

Figure 1:
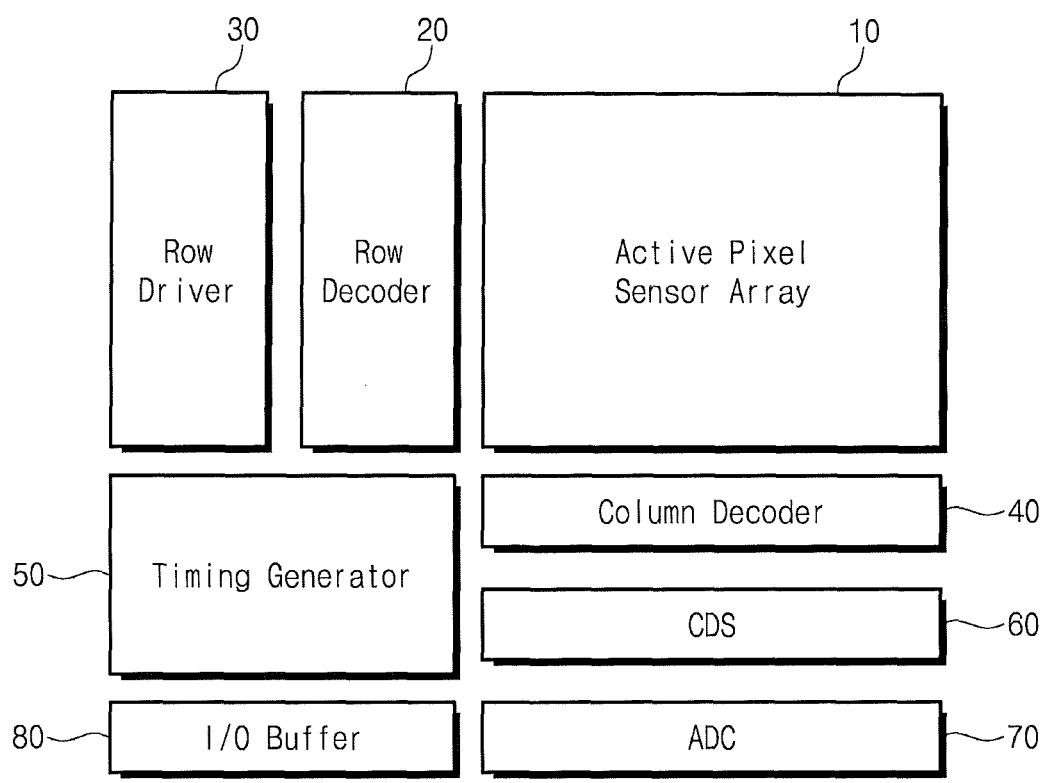
FIG. 1 is a block diagram illustrating an image sensor according to some embodiments of the present disclosure.

Example embodiments are described below with reference to the accompanying drawings. Many different forms and embodiments are possible without deviating from the spirit and teachings of this disclosure and so the disclosure should not be construed as limited to the example embodiments set forth herein. Rather, these example embodiments are provided so that this disclosure will be thorough and complete, and will convey the scope of the disclosure to those skilled in the art. In the drawings, the sizes and relative sizes of layers and regions may be exaggerated for clarity. Like reference numbers refer to like elements throughout the description.

The terminology used herein is for the purpose of describing particular embodiments only and is not intended to be limiting of the embodiments. As used herein, the singular forms "a," "an," and "the" are intended to include the plural forms as well, unless the context clearly indicates otherwise. It will be further understood that the terms "comprises," "comprising," "includes," and/or "including," when used in this specification, specify the presence of the stated features, steps, operations, elements, and/or components, but do not preclude the presence or addition of one or more other features, steps, operations, elements, components, and/or groups thereof.

It will be understood that when an element is referred to as being "coupled," "connected," or "responsive" to, or "on," another element, it can be directly coupled, connected, or responsive to, or on, the other element, or intervening elements may also be present. In contrast, when an element is referred to as being "directly coupled," "directly connected," or "directly responsive" to, or "directly on," another element, there are no intervening elements present. As used herein the term "and/or" includes any and all combinations of one or more of the associated listed items.

Spatially relative terms, such as "beneath," "below," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device may be otherwise oriented (rotated 90 degrees or at other orientations) and the spatially relative descriptors used herein may be interpreted accordingly.

Example embodiments of the present disclosure are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the present disclosure should not be construed as limited to the particular shapes of regions illustrated herein but are to include deviations in shapes that result, for example, from manufacturing. Accordingly, the regions illustrated in the figures are schematic in nature and their shapes are not intended to illustrate the actual shape of a region of a device and are not intended to limit the scope of example embodiments.

It will be understood that although the terms "first," "second," etc. may be used herein to describe various elements, these elements should not be limited by these terms. These terms are only used to distinguish one element from another. Thus, a "first" element could be termed a "second" element without departing from the teachings of the present embodiments.

Unless otherwise defined, all terms (including technical and scientific terms) used herein have the same meaning as commonly understood by one of ordinary skill in the art to which this present disclosure belongs. It will be further understood that terms, such as those defined in commonly used dictionaries, should be interpreted as having a meaning that is consistent with their meaning in the context of the relevant art and/or the present specification and will not be interpreted in an idealized or overly formal sense unless expressly so defined herein.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

FIG. 1 is a block diagram illustrating an image sensor according to some embodiments of the present disclosure.

Referring to FIG. 1, an image sensor may include an active pixel sensor array 10, a row decoder 20, a row driver 30, a column decoder 40, a timing generator 50, a correlated double sampler (CDS) 60, an analog-to-digital converter (ADC) 70, and an I/O buffer 80.

The active pixel sensor array 10 may include a plurality of unit pixels that are two-dimensionally arranged and are configured to convert optical signals to electrical signals. The active pixel sensor array 10 may be driven by one or more of a plurality of driving signals, such as a pixel selection signal, a reset signal, and a charge transfer signal, which are transmitted from the row driver 30. An electrical signal that results from the conversion of an optical signal by a unit pixel of the active pixel sensor array 10 may be transmitted to the CDS 60.

The row driver 30 may provide a plurality of driving signals (e.g., the pixel selection signal, the reset signal, and the charge transfer signal mentioned above) to the active pixel sensor array 10 for driving a plurality of unit pixels, in accordance with the decoded result obtained from the row decoder 20. In the case where the unit pixels are arranged in a matrix shape, the driving signals from the row driver 30 may be applied to the respective rows.

The timing generator 50 may provide timing and control signals to the row decoder 20 and the column decoder 40.

The CDS 60 may receive the electric signals generated in the active pixel sensor array 10, and the received electric signals may be held and sampled in the CDS 60. The CDS 60 may perform a double sampling operation on a specific noise level and a signal level of the electric signal and may output a difference level corresponding to a difference between the noise and signal levels.

The ADC 70 may be configured to convert analog signals, which may correspond to the difference level outputted from the CDS 60, into digital signals. The ADC 70 may also be configured to output the converted digital signals.

The I/O buffer 80 may be configured to latch the digital signals outputted from the ADC 70 and then to output the latched digital signals to an image signal processing unit (not shown) sequentially in accordance with a decoding result, which may be obtained from the column decoder 40.

Figure 2:
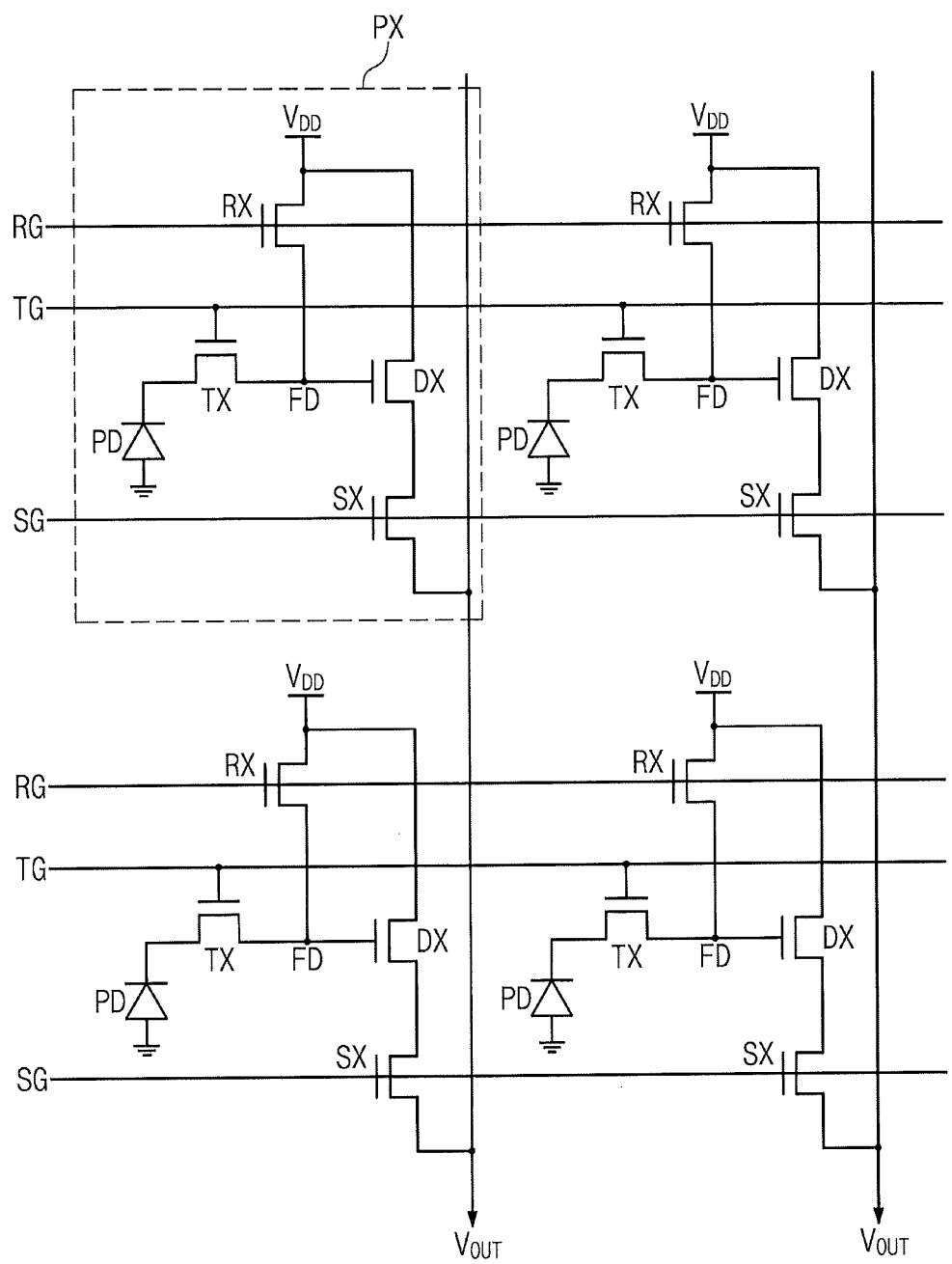
FIG. 2 is a circuit diagram of an active pixel sensor array of an image sensor according to some embodiments of the present disclosure.

FIG. 2 is a circuit diagram of an active pixel sensor array of an image sensor according to some embodiments of the present disclosure.

Referring to FIGS. 1 and 2, the sensor array 10 may include a plurality of unit pixels P, which are arranged in a matrix shape. In some embodiments, the unit pixel PX may include a transfer transistor TX and logic transistors RX, SX, and DX. Here, the logic transistors may include a reset transistor RX, a selection transistor SX, and a drive transistor or source follower transistor DX. The transfer transistor TX may include a transfer gate TG. Each of the unit pixels PX may further include a photoelectric conversion device PD and a floating diffusion region FD.

The photoelectric conversion device PD may be configured to generate and hold photocharges whose amount is in proportion to an amount of light incident therein. The photoelectric conversion device PD may be provided in a form of (for example) a photo diode, a photo transistor, a photo gate, a pinned photo diode (PPD), or any combination thereof. The transfer gate TG may be configured to transfer the photocharges from the photoelectric conversion device to the floating diffusion region FD, where the photocharges may be stored. The drive transistor DX may be controlled by an amount of the photocharges stored in the floating diffusion region FD.

The reset transistor RX may be configured to periodically discharge the photocharges stored in the floating diffusion region FD. The reset transistor RX may include drain and source electrodes, which are respectively connected to the floating diffusion region FD and a node applied with a power voltage VDD. If the reset transistor RX is turned on, the power voltage VDD may be applied to the floating diffusion region FD through the source electrode of the reset transistor RX. Accordingly, the photocharges stored in the floating diffusion region FD may be discharged to the power voltage VDD through the reset transistor RX, thereby rendering the floating diffusion region FD to be in a reset state.

The drive transistor DX, in conjunction with an electrostatic current source (not shown) outside the unit pixel PX, may serve as a source follower buffer amplifier. In other words, the drive transistor DX may be used to amplify a variation in electric potential of the floating diffusion region FD and output the amplified signal to an output line $V_{out}$.

The selection transistor SX may be used to select a row of the unit pixels PX to be read. If the selection transistor SX is turned on, the power voltage VDD may be applied to the source electrode of the drive transistor DX.

Figure 3:
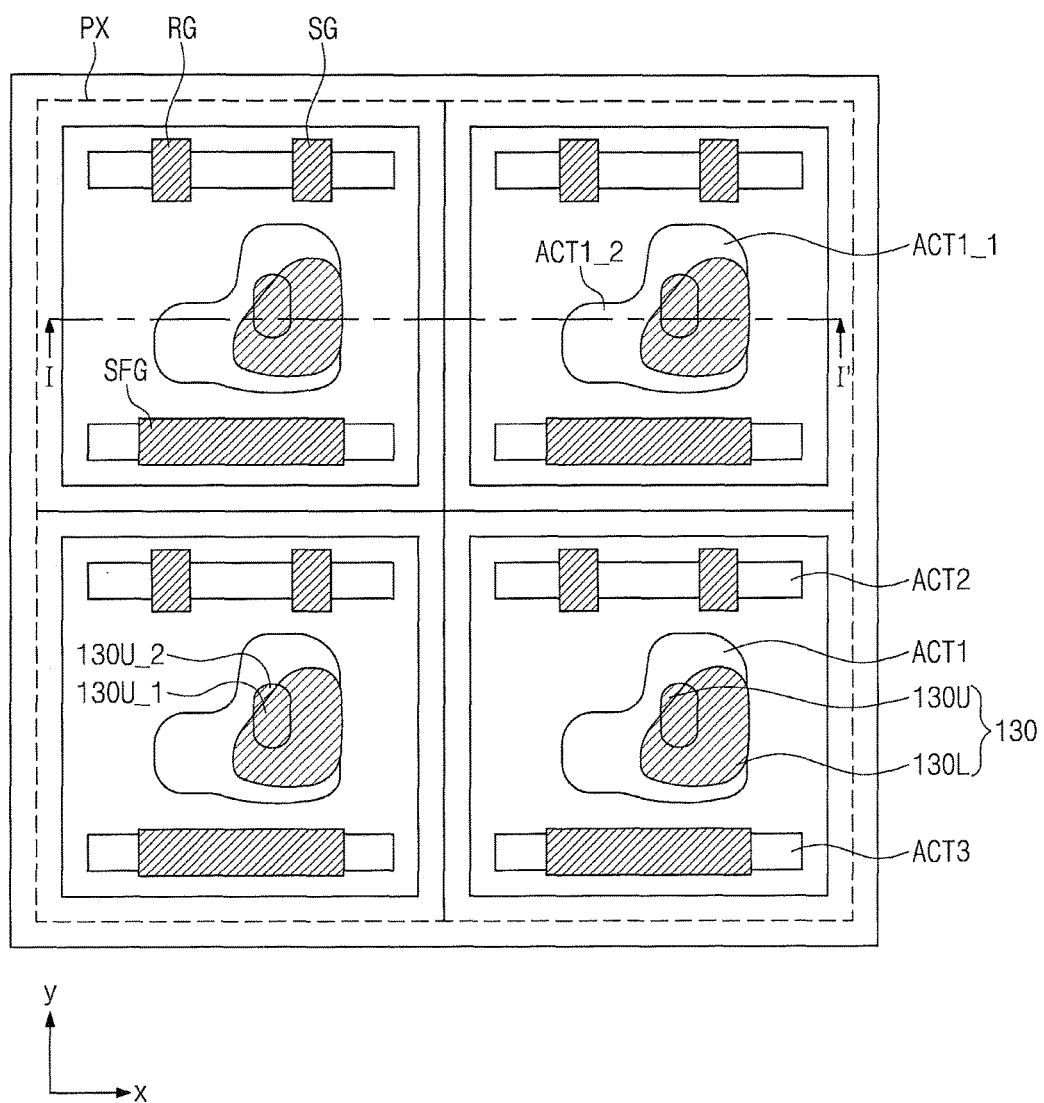
FIG. 3 is a plan view illustrating an image sensor according to an embodiment of the present disclosure.
Figure 4:
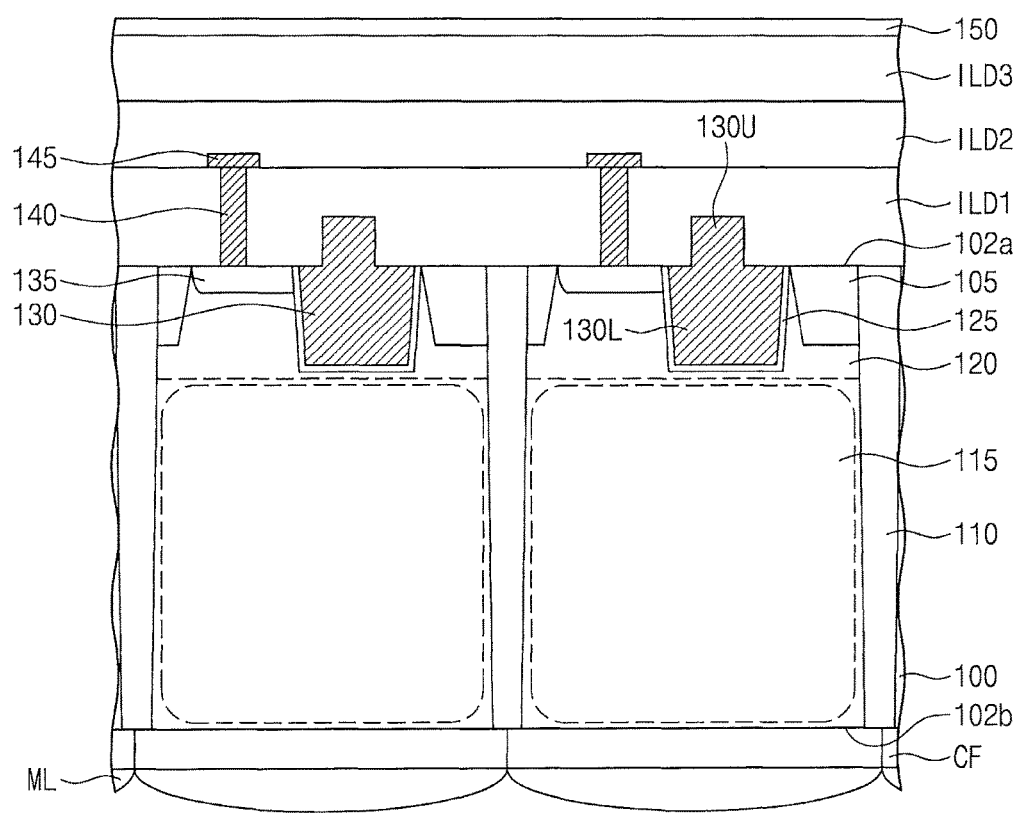
FIG. 4 is a sectional view of the image sensor of FIG. 3, taken along line I-I' of FIG. 3.

FIG. 3 is a plan view illustrating an image sensor according to an embodiment of the prenet disclosure. FIG. 4 is a sectional view taken along line I-I' of FIG. 3. FIG. 5 is an enlarged plan view illustrating a first active pattern and a lower portion of a transfer gate of FIG. 3.

Referring to FIGS. 3 and 4, a substrate 100 may include a plurality of pixel regions PX.

The substrate 100 may be a semiconductor wafer formed of silicon, germanium, or silicon/germanium. Alternatively, the substrate 100 may be provided in the form of a silicon-on-insulator (SOI) wafer, a germanium-on-insulator (GOI) wafer, or a substrate with an epitaxial layer. The substrate 100 may have a first surface 102a and a second surface 102b, which may be an upper surface and a lower surface of the substrate, respectively.

As best seen in FIG. 3, the pixel regions PX may be two-dimensionally arranged in x and y directions. In some embodiments, each pixel region PX may include a first active pattern ACT1, a second active pattern ACT2, and a third active pattern ACT3. When viewed in a plan view, the first active pattern ACT1 may be disposed between the second active pattern ACT2 and the third active pattern ACT3. Also, a transfer gate 130, a reset gate RG, a selection gate SG, and a source follower gate SFG may be formed in a pixel region PX.

As illustrated in FIG. 4, an interconnection structure may be provided on the first surface 102a of the substrate 100. The interconnection structure may include interconnection patterns 140 and 145 connected to logic transistors. The transfer gate 130, the reset gate RG, the selection gate SG, and the source follower gate SFG may serve as gate electrodes of the logic transistors.

A color filter layer CF and a micro lens ML may be provided on the second surface 102b of the substrate 100. The color filter layer CF and the micro lens ML may be provided on each of the pixel regions PX. The color filter layer CF may include red, green, or blue color filters, and the color of the color filters may be dependent on a position of the unit pixel PX thereunder. The micro lens ML may be a convex structure and may be configured to focus the incident light on each of the pixel regions PX. In certain embodiments, a planarization layer (not shown) may be further provided between the second surface 102b of the substrate 100 and the color filter layer CF.

Each of the pixel regions PX may include a photoelectric conversion layer 115 and a well impurity layer 120. The photoelectric conversion layer 115 may be configured to generate photocharges in proportion to an intensity of the incident light. The photoelectric conversion layer 115 may be formed by injecting impurities into the substrate 100 and may have a different conductivity type from the substrate 100. Furthermore, the photoelectric conversion layer 115 may be formed to have a difference in doping concentration between their regions adjacent to the first and second surfaces 102a and 102b, and as a result, a potential difference may be produced between the first and second surfaces 102a and 102b of the substrate 100. For example, the photoelectric conversion layer 115 may include a plurality of vertically-stacked impurity regions. The well impurity layer 120 may be provided on the photoelectric conversion layer 115 and adjacent to the first surface 102a of the substrate 100 and may be doped to have a different conductivity type from the photoelectric conversion layer 115. In some embodiments, the photoelectric conversion layer 115 may be doped to have an n-type conductivity, and the well impurity layer 120 may be doped to have a p-type conductivity.

The well impurity layer 120 may be vertically spaced apart from the photoelectric conversion layer 115. When viewed in a plan view, the well impurity layer 120 may be overlapped with the photoelectric conversion layer 115.

A first device isolation layer 110 may be provided to penetrate the substrate 100 from the first surface 102a to the second surface 102b. In some embodiments, the first device isolation layer 110 may be provided to define each of the pixel regions PX in the substrate 100 and to enclose the photoelectric conversion layer 115. The first device isolation layer 110 may be formed of an insulating material, whose refractive index is lower than that of the substrate 100. For example, the first device isolation layer 110 may be formed of or include at least one of silicon, silicon nitride, undoped polysilicon, or air. The first device isolation layer 110 may reflect or refract an incident light that is incident to the photoelectric conversion layer 115 at an angle. The first device isolation layer 110 may be configured to prevent photocharges, which are generated by the incident light, from being moved from one of the pixel regions PX to a neighboring one of the pixel regions PX through a random drift phenomenon.

A second device isolation layer 105 may be provided to define the first active pattern ACT1, the second active pattern ACT2, and the third active pattern ACT3 in each of the pixel region PX. The first, second, and third active patterns ACT1, ACT2, and ACT3 may be provided to be spaced apart from each other and to have different sizes. Referring to FIG. 5, when viewed in a plan view, the first active pattern ACT1 may be provided at a center region of the pixel region PX and may include a first portion ACT1_1 having a protruding shape and a second portion ACT1_2 having a width larger than that of the first portion ACT1_1. In other words, the first active pattern ACT1 may be shaped like a letter 'L', when viewed in a plan view. Referring back to FIG. 3, the first active pattern ACT1 may be disposed between the second active pattern ACT2 and the third active pattern ACT3, and the second active pattern ACT2 and the third active pattern ACT3 may be disposed at edge regions of the pixel region PX, when viewed in a plan view. The second active pattern ACT2 and the third active pattern ACT3 may face each other across the first active pattern ACT1 and may have the same width and the same length. However, the shapes of the first active pattern ACT1, the second active pattern ACT2 and the third active pattern ACT3 may not be limited thereto.

In some embodiments, the second device isolation layer 105 may be formed in the well impurity layer 120. The second device isolation layer 105 may be formed to have a bottom surface that is positioned in the well impurity layer 120 and is spaced apart from the photoelectric conversion layer 115. When measured from the first surface 102a of the substrate 100, a vertical depth of the second device isolation layer 105 may be smaller than that of the first device isolation layer 110. The second device isolation layer 105 and the first device isolation layer 110 may be in direct contact with each other.

The formation of the second device isolation layer 105 may include patterning the first surface 102a of the substrate 100 to form a shallow trench (not shown), forming a silicon nitride liner to conformally cover the shallow trench, and then, filling the shallow trench provided with the silicon nitride liner with an insulating material (e.g., a high-density plasma (HDP) oxide and an undoped silicon glass (USG).

The transfer gate 130 and a floating diffusion region 135 may be formed on and in the first active pattern ACT1 of the pixel region PX. The floating diffusion region 135 may be formed in the first portion ACT1_1 of the first active pattern ACT1. The floating diffusion region 135 may be formed by injecting impurities having a different conductivity type from the well impurity layer 120 into the first portion ACT1_1. For example, the floating diffusion region 135 may be an n-type impurity region.

The transfer gate 130 may be formed on the second portion ACT1_2 of the first active pattern ACT1. The transfer gate 130 may include a lower portion 130L, which is inserted in the well impurity layer 120 (and therefore is below the first surface 102a of the substrate 100), and an upper portion 130U, which is connected to the lower portion 130L and extends upward with respect to the first surface 102a of the substrate 100. The upper portion 130U of the transfer gate 130 may be provided to have an area and a width that are smaller than those of the lower portion 130L of the transfer gate 130. The upper portion 130U of the transfer gate 130 may be provided in such a way that its center is shifted from a center of the lower portion 130L of the transfer gate 130. For example, the upper portion 130U of the transfer gate 130 may be provided in such a way that its center is shifted from the center of the lower portion 130L of the transfer gate 130 in a direction toward the floating diffusion region 135. As best seen in FIG. 3, the upper portion 130U of the transfer gate 130 may include a first portion 130U_1, which is overlapped with the lower portion 130L of the transfer gate 130, and a second portion 130U_2, which is connected to the first portion 130U_1 and is overlapped with the first active pattern ACT1.

The lower portion 130L of the transfer gate 130 may be provided to penetrate at least a portion of the well impurity layer 120. The lower portion 130L of the transfer gate 130 may be formed to have a depth, allowing photocharges to pass over a potential barrier between the transfer gate 130 and the photoelectric conversion layer 115. Although not shown in FIG. 4, in some embodiments of the present disclosure, the lower portion 130L of the transfer gate 130 may be extended into the photoelectric conversion layer 115.

In some embodiments, when viewed in a plan view (e.g., as best seen in FIG. 5), the lower portion 130L of the transfer gate 130 may include a first surface 130L_1, which is positioned at an interface between the device isolation layer 105 and the first active pattern ACT1, a second surface 130L_2, which is connected to the first surface 130L_1, and a third surface 130L3 connected to both the first and second surfaces 130L1 and 130L2. The third surface 130L_3 may be provided to face the floating diffusion region 135. The first surface 130L_1 may extend largely in the y direction, and the second surface 130L_2 may extend largely in the x direction. The third surface 130L_3 may have an angle of about 30° to 60° with respect to the x-axis (illustrated by the θ symbol in FIG. 5). For example, the third surface 130L_3 may have an angle of about 45° with respect to the x-axis. When viewed in a plan view, the lower portion 130L of the transfer gate 130 may have a substantially triangular shape. The transfer gate 130 may have smoothly-curved corner portions, and therefore the transfer gate may have a tri-oval shape. In some embodiments, in the case where the substrate 100 is a silicon wafer, the third surface 130L_3 may have a crystal plane of (100). In certain embodiments, the lower portion 130L of the transfer gate 130 may have a polygonal structure with the third surface 130L_3. However, the structure of the lower portion 130L of the transfer gate 130 may not be limited thereto.

In some embodiments, when viewed in a plan view, the second portion ACT1_2 of the first active pattern ACT1 may have a first surface ACT1_1S near the second active pattern ACT2 and a second surface ACT1_2S near the third active pattern ACT3. The first surface ACT1_1S and the second surface ACT1_2S may face each other. When measured form the lower portion 130L of the transfer gate 130, a distance DT1 to the first surface ACT1_1S of the first active pattern ACT1 may be greater than a distance DT2 to the second surface ACT1_2S of the first active pattern ACT1.

A gate insulating layer 125 may be interposed between the transfer gate 130 and the substrate 100. Referring to FIG. 5, the gate insulating layer 125 may be provided to enclose the lower portion 130L of the transfer gate 130 and to have a non-uniform thickness. The gate insulating layer 125 may have a first portion having a first thickness TH1 and a second portion having a second thickness TH2 greater than the first thickness TH1. For example, the second portion of the gate insulating layer 125 may be disposed between the corner portions of the transfer gate 130 and the well impurity layer 120. Also, the first portion of the gate insulating layer 125 may be disposed between the third surface 130L_3 of the transfer gate 130 and the well impurity layer 120. In other words, the gate insulating layer 125 in contact with the third surface 130L_3 may have the first thickness TH1 that is smaller than a thickness (e.g., the thickness TH2) of the other portion.

In some embodiments of the present disclosure, the lower portion 130L of the transfer gate 130 may have a polygonal structure with the third surface 130L_3, when viewed in a plan view. Also, the first thickness TH1 of the gate insulating layer 125 interposed between the third surface 130L_3 and the well impurity layer 120 may be smaller than the second thickness TH2 of the other portion.

A portion of the gate insulating layer 125 adjacent to the third surface 130L_3 of the lower portion 130L of the transfer gate 130 may be formed to be thinner than the other portion, and this may make it possible to allow electrons to be more efficiently transferred from the photoelectric conversion layer 115 to the floating diffusion region 135.

The reset gate RG and the selection gate SG may be disposed on the second active pattern ACT2 of the pixel region PX. The source follower gate SFG may be disposed on the third active pattern ACT3 of the pixel region PX. Gate insulating layers (not shown) may be respectively interposed between the well impurity layer 120 and each of the reset gate RG, the selection gate SG and the source follower gate SFG.

Referring to FIG. 3, a first interlayered insulating layer ILD1 may be provided on the first surface 102a of the substrate 100 to cover the transfer gate 130, the reset gate RG, the selection gate SG, and the source follower gate SFG. A plurality of contact plugs 140 may be disposed in the first interlayered insulating layer ILD1. In some embodiments, one of the contact plugs 140 may be electrically coupled to the floating diffusion region 135. Although not shown in detail, impurity regions may be formed at both sides of each of the reset gate RG, the selection gate SG, and the source follower gate SFG, and some of the contact plugs 140 may be electrically connected to the impurity regions, respectively.

A second interlayered insulating layer ILD2 may be formed to cover the contact plugs 140, and the interconnection lines 145 may be formed on the contact plugs 140. A third interlayered insulating layer ILD3 and a passivation layer 150 may be provided on the second interlayered insulating layer ILD2.

Therefore, according to aspects described herein, an image sensor may be provided, and the image sensor may include a substrate 100 including an active region therein. A photoelectric conversion layer 115 may be formed in the active region, and a well impurity layer 120 may be formed in the substrate 100 and on the photoelectric conversion layer 115. A floating diffusion region 135 may be formed in a portion of the well impurity layer 120; and a transfer gate 130 may be positioned in the well impurity layer 120 and having a first surface facing the floating diffusion region 135. A gate insulating layer 125 of non-uniform thickness may be interposed between the well impurity layer 120 and the transfer gate 130, wherein a first thickness of the gate insulating layer 125 interposed between the first surface and the well impurity layer 120 may be thinner than a second thickness of the gate insulating layer 125 interposed between a second surface of the transfer gate 130 and the well impurity layer 120.

FIGS. 6A, 7A, 8A, and 9A are sectional views taken along line I-I' of FIG. 3 to illustrate a method of fabricating an image sensor, according to some embodiments of the present disclosure. FIGS. 6A to 9A are sectional views taken along line I-I' of FIG. 3. FIGS. 6B, 7B, 8B, and 9B are plan views, each of which illustrates a first active pattern and a transfer gate in a corresponding step shown in FIGS. 6A, 7A, 8A, and 9A, respectively.

Figure 6A:
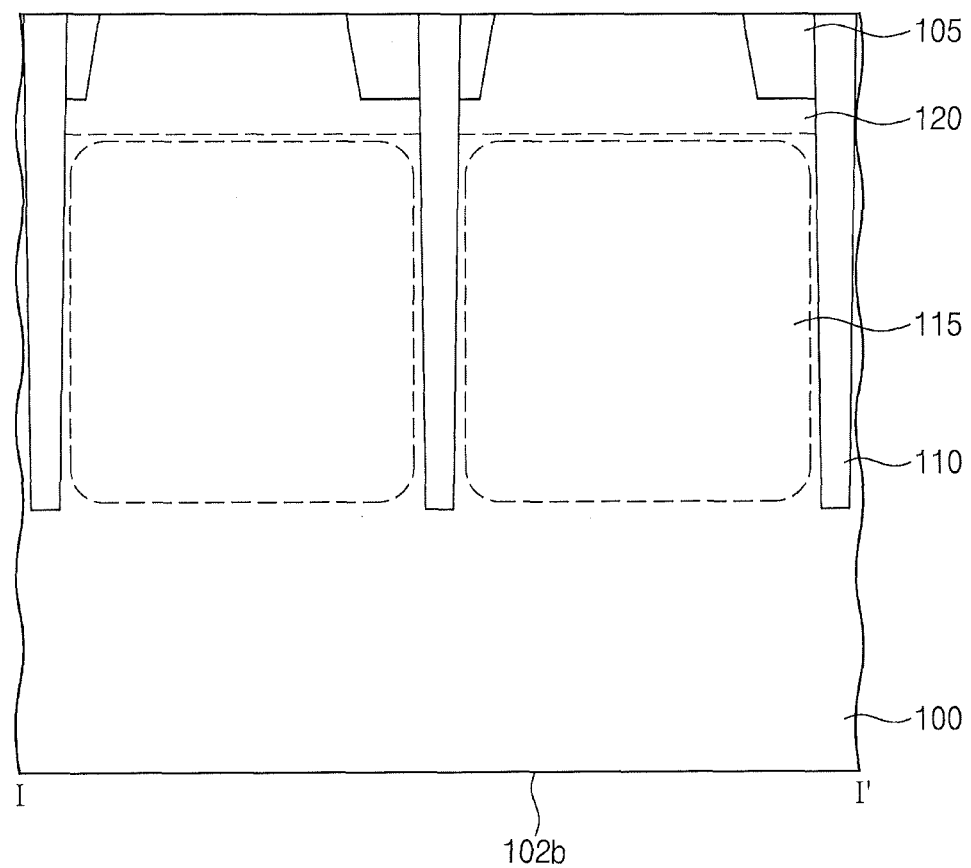
FIGS. 6A, 7A, 8A and 9A are sectional views, taken along line I-I' of FIG. 3, illustrating a method of fabricating an image sensor, according to some embodiments of the present disclosure.
Figure 6B:
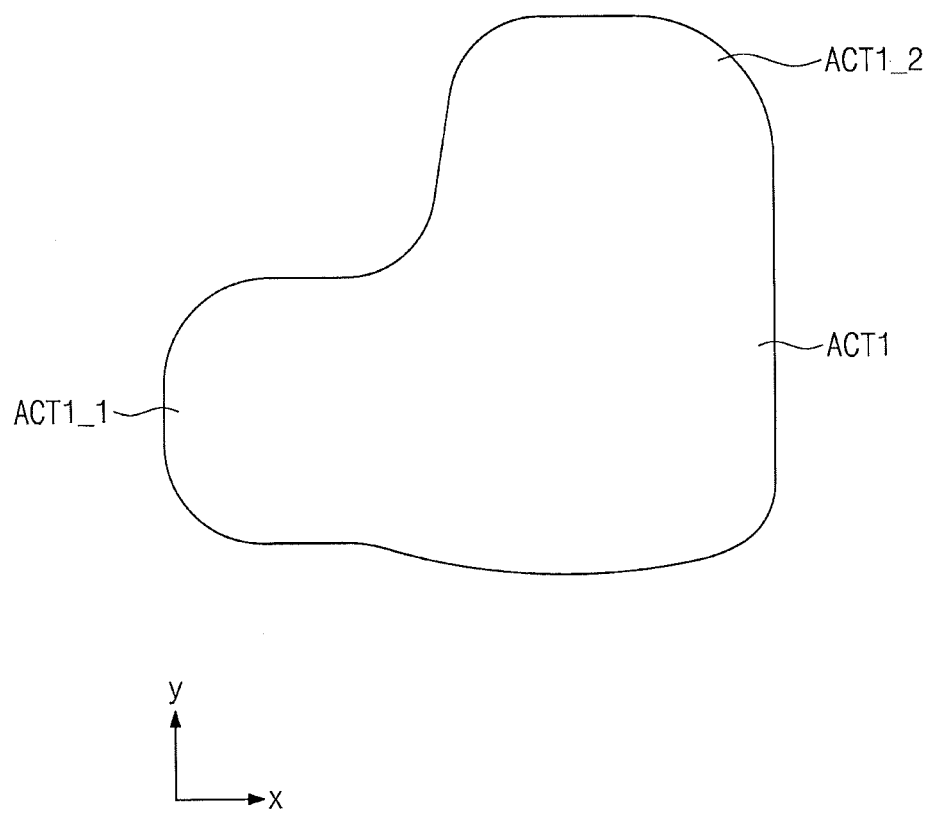
FIGS. 6B, 7B, 8B and 9B are plan views illustrating a method of fabricating an image sensor, according to some embodiments of the present disclosure.

Referring to FIGS. 6A and 6B, a substrate 100 may be formed of or include silicon and may have a first surface 102a and a second surface 102b. A first device isolation layer 105 may be formed to define pixel regions, and the formation of the first device isolation layer 105 may include forming a first trench to penetrate the first surface 102a and to have a first depth and then filling the first trench with an insulating material. A second device isolation layer 110 may be formed to define an active pattern in each pixel region, and here, the formation of the second device isolation layer 110 may include forming a second trench to penetrate the first surface 102a of the substrate 100 provided with the first device isolation layer 105 and to have a second depth greater than the first depth and then filling the second trench with an insulating layer. The second device isolation layer 110 may be formed to penetrate a portion of the first device isolation layer 105. As shown in FIG. 6B, the active pattern may include a first active pattern ACT1, which is formed to have substantially the same shape as that of FIG. 3. The first active pattern ACT1 may include a first portion ACT1_1 and a second portion ACT1_2, whose width is greater than that of the first portion ACT1_1. For example, the first active pattern ACT1 may be shaped like a letter 'L', when viewed in a plan view.

In each of the pixel regions defined by the second device isolation layer 110, an ion implantation process may be performed on the first surface 102a at least one time to form a photoelectric conversion layer 115. First impurities of a first conductivity type may be injected into an upper portion of the photoelectric conversion layer 115 to form a well impurity layer 120. The well impurity layer 120 may be formed to be spaced apart from or be overlapped with the photoelectric conversion layer 115.

Figure 7A:
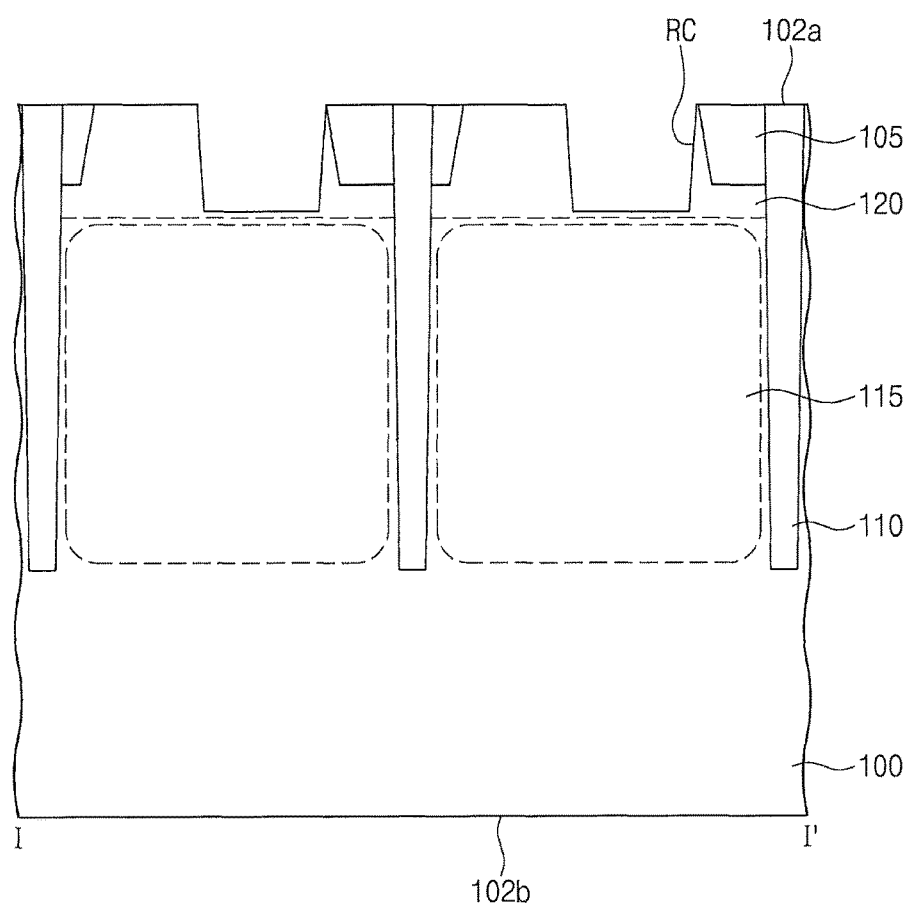
Figure 7B:
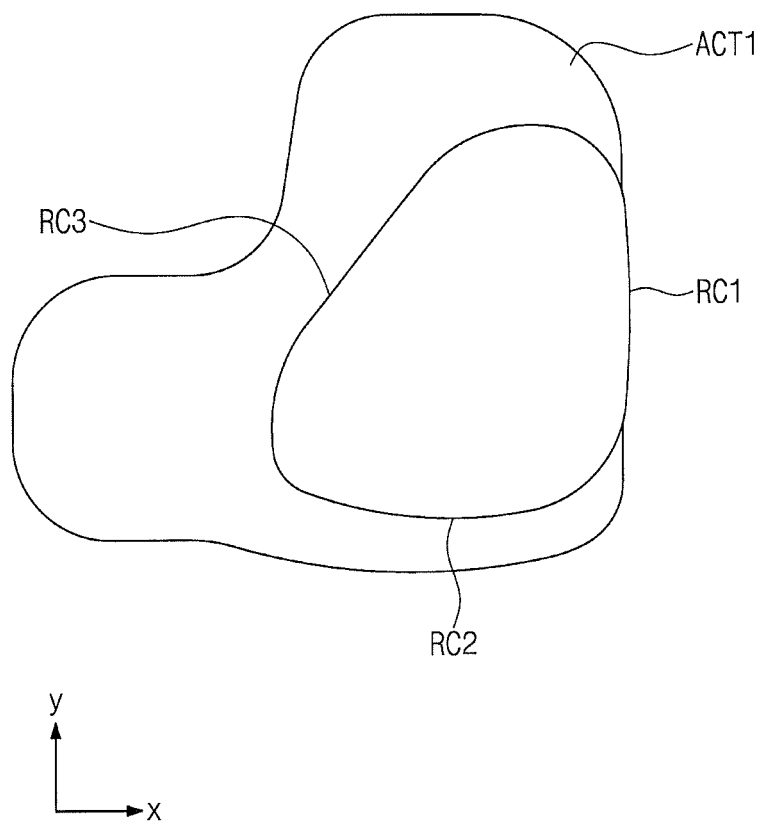

Referring to FIGS. 7A and 7B, a recess RC may be formed to penetrate the first surface 102a of the substrate 100 provided with the well impurity layer 120. The recess RC may be formed to partially penetrate the well impurity layer 120. The recess RC may be formed by an anisotropic etching process, and in this case, dangling bonds may be produced on a surface of the substrate 100 exposed by the recess RC. The number or density of the dangling bonds may be higher at a curved or corner portion than at a flat portion. Also, the number or density of the dangling bonds may be higher at a crystal plane of (111) or (110) than at a crystal plane of (100), because a surface density of silicon is higher at the crystal plane of (111) or (110) than at the crystal plane of (100).

When viewed in a plan view (e.g., as best seen in FIG. 7B), the recess RC may have a triangular shape with rounded corners (e.g., a substantially triangular shape or a tri-oval shape). As an example, the recess RC may include a first surface RC1 in contact with an end portion of the first active pattern ACT1, a second surface RC2 substantially perpendicular to the first surface RC1, and a third surface RC3 connected to the first surface RC1 and the second surface RC2. The third surface RC3 may form an acute angle with respect to the second surface RC2. The third surface RC3 may have a crystal plane of (100). Since the number or density of the dangling bonds may be higher at a crystal plane of (111) or (110) than at a crystal plane of (100), the number or density of dangling bond defects may be less on the third surface RC3 than on other portions, such as first surface RC1 and second surface RC2.

Although not shown, in certain embodiments, the recess RC may be extended into an upper portion of the photoelectric conversion layer 115.

Figure 8A:
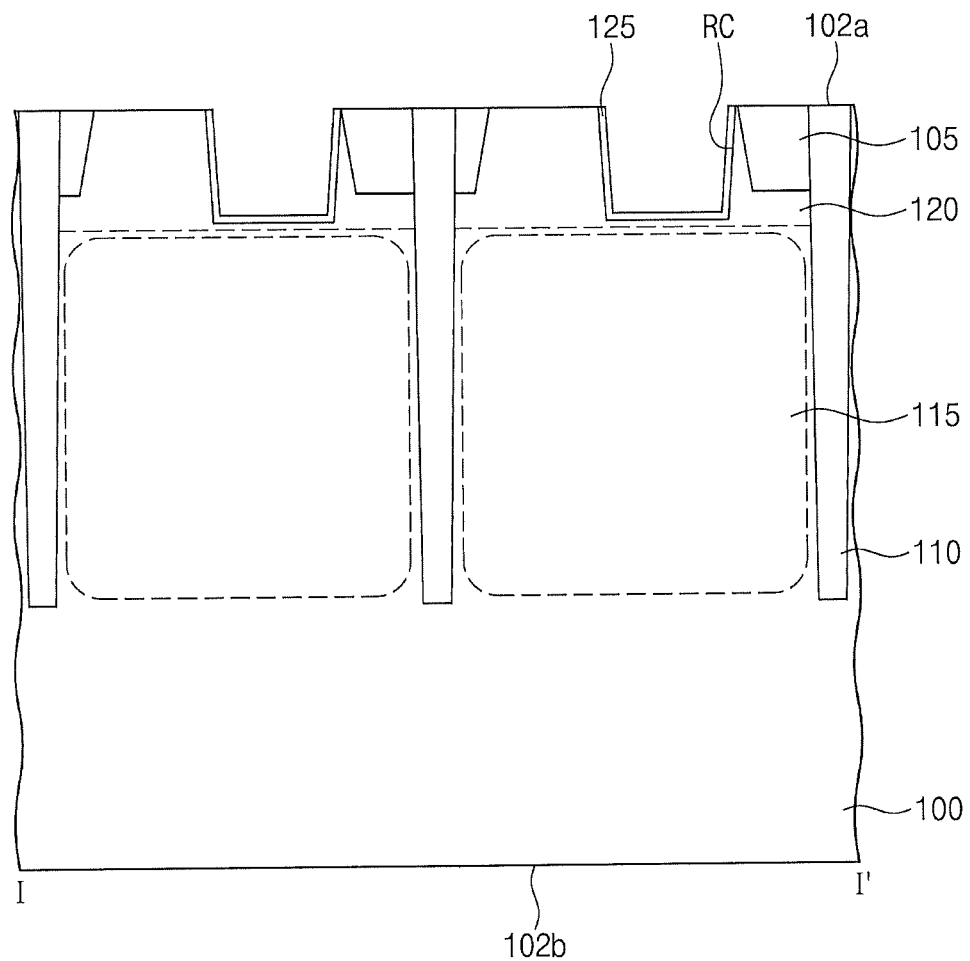
Figure 8B:
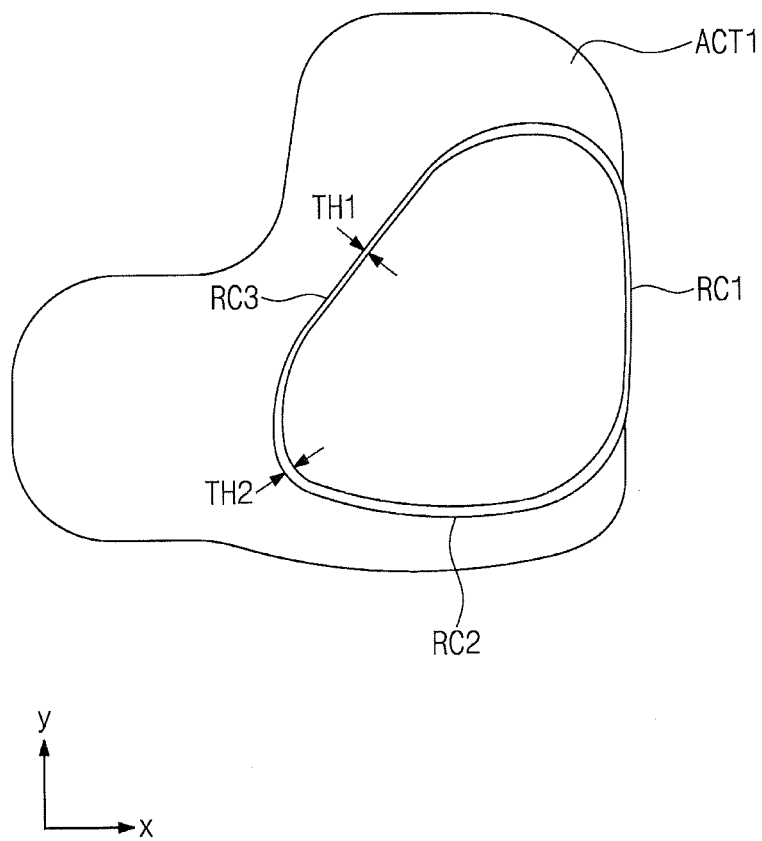

Referring to FIGS. 8A and 8B, a gate insulating layer 125 may be formed to cover the substrate 100 with the recess RC. In some embodiments, the gate insulating layer 125 may be formed by oxidizing the substrate 100 exposed by the recess RC. In the case where the substrate 100 includes silicon, the gate insulating layer 125 may be formed of or include silicon oxide.

The gate insulating layer 125 may be formed to have a non-uniform thickness. For example, in the case where the gate insulating layer 125 is formed by an oxidation process, the more the silicon dangling bonds, the thicker a silicon oxide layer formed by the oxidation process. Thus, the gate insulating layer 125 may be formed to have a larger thickness on the recess RC of the corner or curved portion where there are more silicon dangling bonds. Also, the gate insulating layer 125 may be formed to be thicker on a crystal plane of (111) or (110) than on a crystal plane of (100). Since, as described above, the third surface RC3 has the crystal plane of (100), the thickness of the gate insulating layer 125 may be smaller on the third surface RC3 than on the other portions. For example, the gate insulating layer 125 may have a first thickness TH1 on the third surface RC3 and may have a second thickness TH2 greater than the first thickness TH1 on the other portions.

Figure 9A:
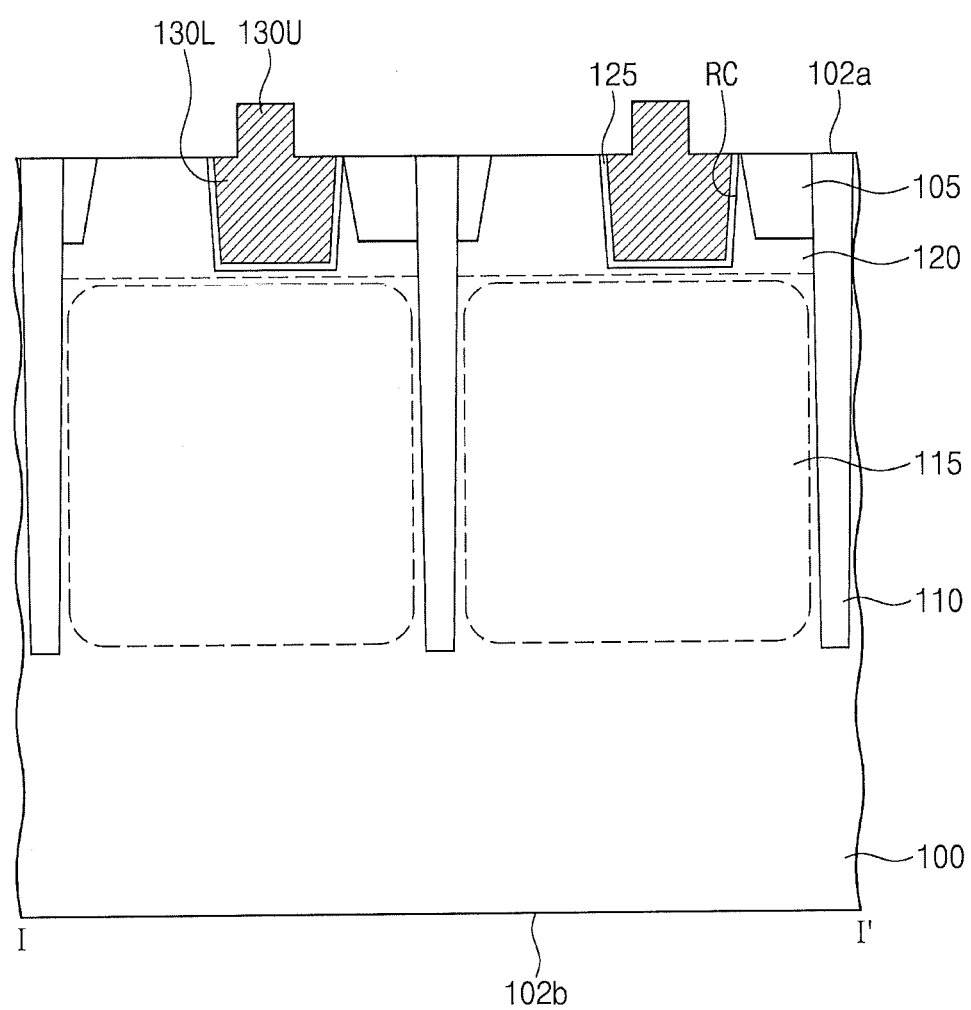
Figure 9B:
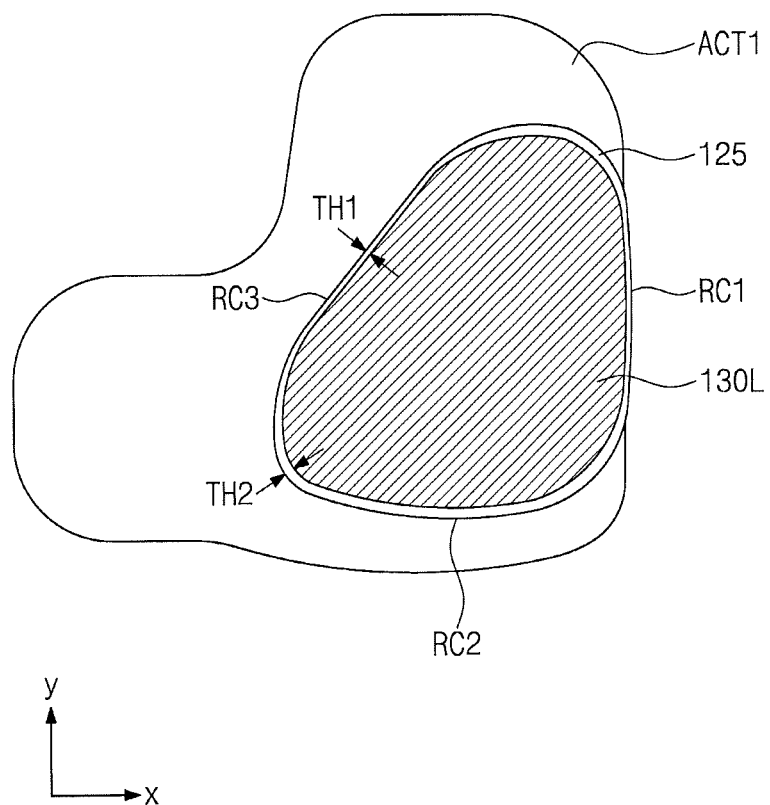

Referring to FIGS. 9A and 9B, a conductive layer (not shown) may be formed to fill the recess RC provided with the gate insulating layer 125 and to cover the first surface 102a of the substrate 100. Thereafter, the conductive layer may be etched to form a transfer gate 130 including a lower portion 130L filling the recess RC and an upper portion 130U protruding upward with respect to the first surface 102a of the substrate 100.

A floating diffusion region 135 may be formed in the well impurity layer 120. The floating diffusion region may be formed by an ion implantation process, in which the transfer gate 130 is used as an ion implantation mask. In some embodiments, the well impurity layer 120 may be formed to have a second conductivity type different from the first conductivity type.

Referring back to FIG. 4, the second surface 102b of the substrate 100 may be polished to expose a lower portion of the second device isolation layer 110, and then, a planarization layer (not shown), a color filter layer CF, and a micro lens ML may be sequentially formed on the second surface 102b of the substrate 100.

Figure 10A:
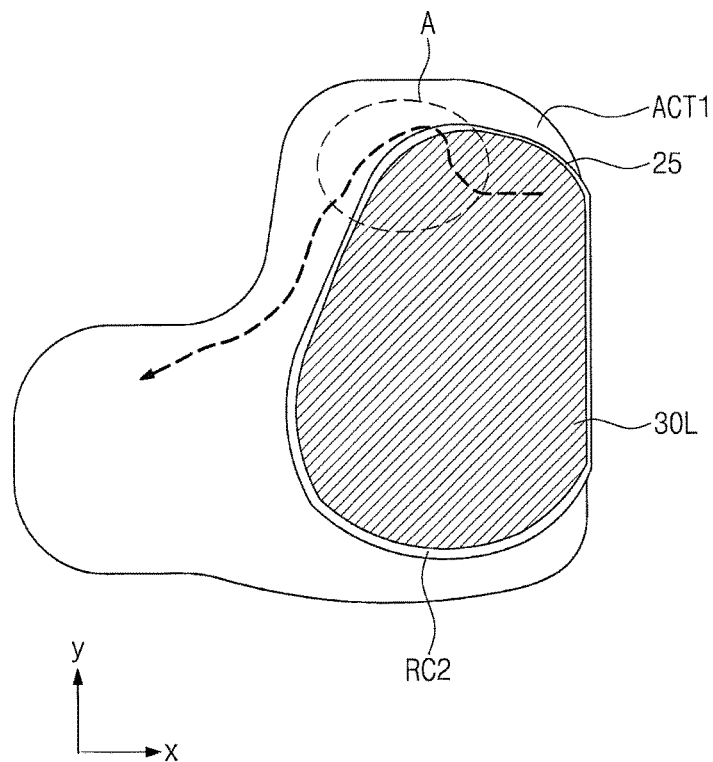
FIG. 10A is a plan view illustrating a conduction path of electrons in a conventional image sensor.
Figure 10B:
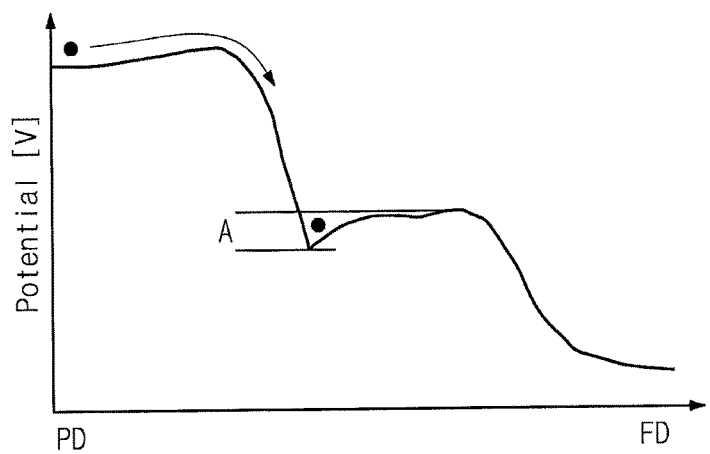
FIG. 10B is a graph of an electric potential in the image sensor of FIG. 10A.

FIG. 10A is a plan view illustrating a conduction path of electrons in a conventional image sensor, and FIG. 10B is a graph of an electric potential in the image sensor of FIG. 10A. Movement of electrons in the image sensor of FIG. 10A (for example, from a photoelectric conversion layer to a floating diffusion region through a transfer gate) will be described with reference to FIG. 10B.

Figure 11A:
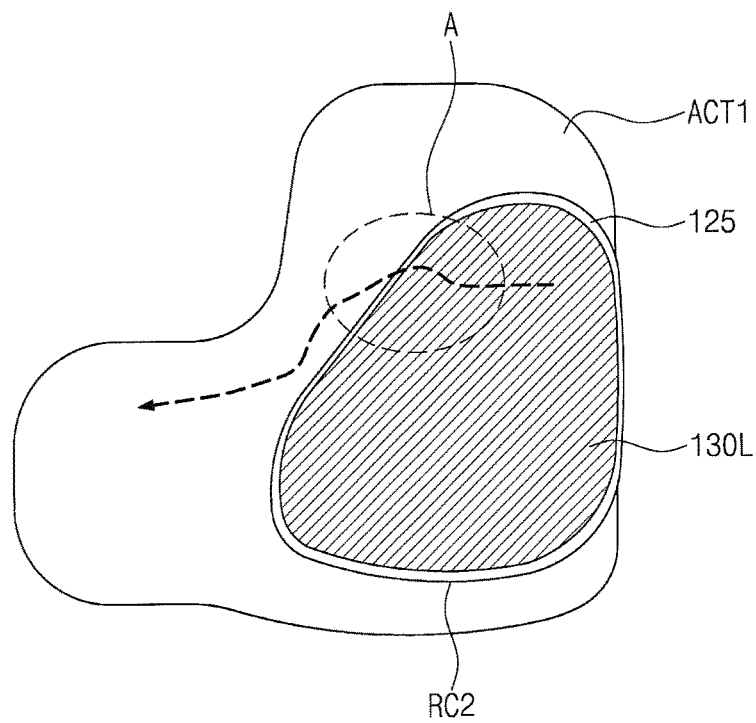
FIG. 11A is a plan view illustrating a conduction path of electrons in an image sensor according to an embodiment of the present disclosure.
Figure 11B:
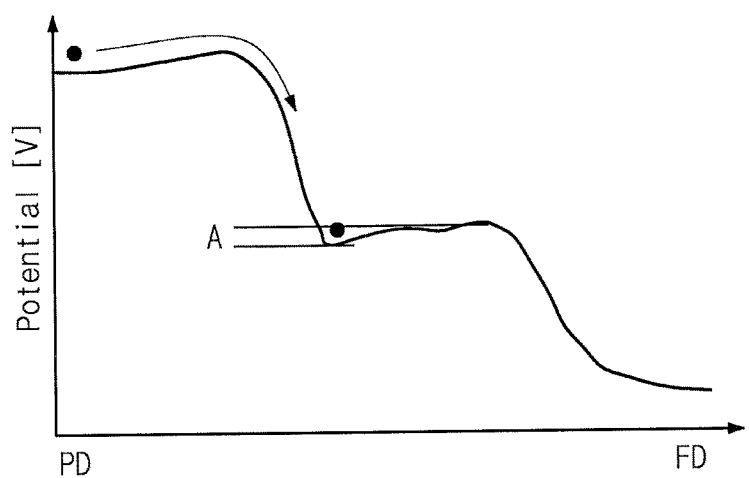
FIG. 11B is a graph of an electric potential in the image sensor of FIG. 11A.

FIG. 11A is a plan view illustrating a conduction path of electrons in an image sensor according to an embodiment of the present disclosure, FIG. 11B is a graph of an electric potential in the image sensor of FIG. 11A. Movement of electrons in the image sensor of FIG. 11A will be described with reference to FIG. 11B.

An active pattern may include a first portion having a protruding shape and a second portion connected to the first portion and may be defined by a device isolation layer. In image sensors according to the conventional art and the present disclosure, transfer gates may be provided on the second portion of the active pattern. Also, each of the transfer gates may include a lower portion inserted into a well impurity layer and an upper portion having a top higher than that of the substrate.

FIGS. 10A and 11A show the lower portions of the transfer gates of the image sensors according to the conventional art and the present disclosure, respectively. Hereinafter, the lower portion of the transfer gate of the conventional image sensor will be referred to as a 'first transfer gate 30L', and the lower portion of the transfer gate of the image sensor according to the present disclosure will be referred to as a 'second transfer gate 130L'. In addition, a first gate insulating layer 25 may be interposed between the active pattern ACT1 and the first transfer gate 30L, and a second gate insulating layer 125 may be interposed between the active pattern ACT1 and the second transfer gate 130L.

Referring to FIG. 10A, the first transfer gate 30L may have an ellipse-like shape whose lower portion is wider than upper portion in a plan view. As described above, since more dangling bonding defects are produced at the corner or rounded portion of the transfer gate, the first gate oxide 25 formed by the oxidation process may be thicker at the corner or rounded portion of the transfer gate. Thus, as shown in a circle A of FIG. 10A, electrons may be transferred from a photoelectric conversion layer PD to a floating diffusion region FD along a path detouring around a portion relatively thick portion of the first gate insulating layer 25.

Referring to FIG. 11A, the second transfer gate 130L may have a triangle-like shape. The second gate insulating layer 125 may be relatively thinner on an oblique side of the second transfer gate 130L than on the other portions. This may make it possible to more easily transfer electrons from the photoelectric conversion layer PD to the floating diffusion region FD.

In the case where the transfer gate is provided in the form of FIG. 10B, a potential difference on the current path shown in the circle A may be about 154 mV. By contrast, in the case where the transfer gate is provided in the form of FIG. 11B, a potential difference on the current path shown in the circle A may be about 90 mV. This difference in electric potential between two structures of FIGS. 10B and 11B may result from a difference in shape of the transfer gates.

According to some embodiments of the present disclosure, a first portion of a gate insulating layer near a lower portion of a transfer gate may be formed to be thinner than another portion, and this may make it possible to allow electrons to be more efficiently transferred from a photoelectric conversion layer to a floating diffusion region.

While example embodiments of the present disclosure have been particularly shown and described, it will be understood by one of ordinary skill in the art that variations in form and detail may be made therein without departing from the spirit and scope of the attached claims.

What is claimed is:

1. An image sensor, comprising:
a substrate including an active region defined by a device isolation layer;
a photoelectric conversion layer in the active region;
a well impurity layer in the substrate and above the photoelectric conversion layer;
a floating diffusion region configured to store photocharges generated in the photoelectric conversion layer, wherein the floating diffusion region is in the well impurity layer and is spaced apart from the photoelectric conversion layer; and
a transfer gate comprising a lower portion in the substrate and an upper portion protruding from the lower portion of the transfer gate,
wherein the lower portion of the transfer gate, when viewed in a plan view, comprises a first surface that contacts the device isolation layer and extends in a first direction, and a second surface facing the floating diffusion region, and
wherein, when viewed in the plan view, the second surface of the lower portion of the transfer gate comprises a straight portion that extends in a second direction, and the first direction and the second direction form an angle in a range of about 30° to about 60°.

2. The image sensor of claim 1, wherein the angle is about 45°.

3. The image sensor of claim 1, wherein the upper portion of the transfer gate is offset in a third direction toward the floating diffusion region from a center, relative to the third direction, of the lower portion of the transfer gate, and wherein the third direction is perpendicular to the first direction.

4. The image sensor of claim 1, wherein the upper portion of the transfer gate comprises a first portion in overlap with the lower portion of the transfer gate and a second portion not overlapped with the lower portion of the transfer gate and overlapped with the well impurity layer.

5. The image sensor of claim 1, wherein, when viewed in the plan view, the lower portion of the transfer gate comprises a rounded corner, and
wherein the transfer gate comprises a gate insulating layer that comprises a first portion extending on the straight portion of the second surface of the lower portion of the transfer gate and a second portion comprising the rounded corner, and the first portion has a first thickness that is less than a second thickness of the second portion.

6. The image sensor of claim 5, wherein the first thickness is a smallest thickness of the gate insulating layer.

7. The image sensor of claim 1, wherein the well impurity layer comprises a doped region having a first conductivity type, and
wherein the floating diffusion region comprises a doped region having a second conductivity type different from the first conductivity type.

8. An image sensor, comprising:
a substrate including an active region defined by a device isolation layer, the substrate comprising a silicon substrate;
a photoelectric conversion layer in the active region;
a floating diffusion region in the active region, wherein the floating diffusion region is configured to store photocharges generated in the photoelectric conversion layer and is spaced apart from the photoelectric conversion layer; and
a transfer gate comprising a lower portion in the active region and an upper portion protruding from the lower portion,
wherein, when viewed in a plan view, the lower portion of the transfer gate comprises a surface facing the floating diffusion region, and the surface comprises a straight portion extending in a direction of a (100) crystal plane of the silicon substrate.

9. The image sensor of claim 8, wherein, when viewed in the plan view, the lower portion of the transfer gate comprises a rounded corner.

10. The image sensor of claim 8, further comprising a well impurity layer in the active region and between the photoelectric conversion layer and a top surface of the substrate,
wherein the lower portion of the transfer gate is provided in a first portion of the well impurity layer, and
the floating diffusion region is provided in a second portion of the well impurity layer different from the first portion of the well impurity layer.

11. An image sensor, comprising:
a substrate including an active region therein, the active region being defined by a device isolation layer;
a photoelectric conversion layer in the active region;
a well impurity layer in the substrate and on the photoelectric conversion layer;
a floating diffusion region in the well impurity layer, wherein the floating diffusion region is configured to store photocharges generated in the photoelectric conversion layer and is spaced apart from the photoelectric conversion layer; and
a transfer gate comprising a lower portion in the substrate and an upper portion protruding from the lower portion of the transfer gate,
wherein the transfer gate comprises a first surface that contacts the device isolation layer and extends hr a first direction and a second surface that faces the floating diffusion region and extends in a second direction, and the first direction and the second direction form an acute angle, and
wherein, when viewed in a plan view, the upper portion of the transfer gate is offset in a third direction toward the floating diffusion region from a center, relative to the third direction, of the lower portion of the transfer gate, and the third direction is perpendicular to the first direction.

12. The image sensor of claim 11, wherein the well impurity layer comprises a doped region having a first conductivity type, and wherein the floating diffusion region comprises a doped region having a second conductivity type different from the first conductivity type.

13. The image sensor of claim 11, wherein a top surface of the upper portion of the transfer gate extends above a top surface of the substrate.

14. The image sensor of claim 11, wherein, when viewed in the plan view, the lower portion of the transfer gate comprises a rounded corner.

15. The image sensor of claim 14, wherein the transfer gate comprises a gate insulating layer, and
wherein the gate insulating layer comprises a first portion contacting the floating diffusion region and a second portion comprising the rounded corner, and the first portion has a first thickness that is less than a second thickness of the second portion.

16. The image sensor of claim 15, wherein the first thickness is a smallest thickness of the gate insulating layer.

17. The image sensor of claim 8, wherein, when viewed in the plan view, the lower portion of the transfer gate comprises a first surface that contacts the device isolation layer and extends in a first direction, wherein, when viewed in the plan view, the upper portion of the transfer gate is offset in a second direction toward the floating diffusion region from a center, relative to the second direction, of the lower portion of the transfer gate in the second direction, and the second direction is perpendicular to the first direction.

18. The image sensor of claim 8, wherein the upper portion of the transfer gate, comprises a portion not overlapping with the lower portion of the transfer gate.

19. The image sensor of claim 9, wherein the transfer gate comprises a gate insulating layer that comprises a first portion extending on the straight portion of the surface of the lower portion of the transfer gate and a second portion comprising the rounded corner, and the first portion has a first thickness that is less than a second thickness of the second portion.

\* \* \* \* \*